United States Patent [19]
Rogren

[11] Patent Number: 5,620,129
[45] Date of Patent: Apr. 15, 1997

[54] DEVICE AND METHOD FOR FORMING AND ATTACHING AN ARRAY OF CONDUCTIVE BALLS

[76] Inventor: Philip E. Rogren, 624 Silver Ave., Half Moon Bay, Calif. 94019-1565

[21] Appl. No.: 390,677

[22] Filed: Feb. 17, 1995

[51] Int. Cl.$^6$ .................................................. B23K 35/14
[52] U.S. Cl. ........................ 228/56.3; 228/246; 428/596
[58] Field of Search ............................. 228/56.3, 180.22, 228/246; 428/596, 597

[56] References Cited

U.S. PATENT DOCUMENTS

| | | | |
|---|---|---|---|
| 3,649,430 | 3/1972 | Lewis et al. | 428/596 |
| 4,050,621 | 9/1977 | Bouley | 228/56.3 |
| 4,216,350 | 8/1980 | Reid | 174/685 |
| 4,557,411 | 12/1985 | Farquharson et al. | 228/56.3 |
| 4,774,760 | 10/1988 | Seaman | 29/840 |
| 4,871,110 | 10/1989 | Fukasawa | 228/245 |
| 4,987,034 | 1/1991 | Hitachi et al. | 428/597 |
| 5,242,097 | 9/1993 | Socha | 228/56.3 |
| 5,284,287 | 2/1994 | Wilson | 228/180.2 |

FOREIGN PATENT DOCUMENTS

| | | | |
|---|---|---|---|
| 125025 | 12/1986 | Japan | 228/246 |

OTHER PUBLICATIONS

IBM TDS, "Bump Tape Connector", vol. 36, No. 09B, pp. 553, 554, Sep. 1993.
Koop, Etched Brazer Perform Sheet, IBM Technical Disclosure Bulletin, vol. 13, No. 8, Jan. '71, p. 2320.

*Primary Examiner*—Samuel M. Heinrich

[57] ABSTRACT

A method and preform for forming and attaching an array of conductive balls, preferably solder balls, to ball receiving areas on a substrate is disclosed. The preform is a connected array of sub-preforms comprised of the conductive material from which the balls will be formed. The connections between adjacent sub-preforms are designed to assure division of the preform into individual masses, each sufficient to form one conductive ball. Each sub-preform is provided with a bottom protrusion which assures physical and thermal contact between preform and substrate. The method involves placing the preform on the substrate such that each sub-preform is positioned above the conductive ball receiving areas. The preform and substrate are than heated to above the melting point of the conductive material to melt the conductive material and form metallurgical bonds between the conductive material and the receiving areas. Surface tension causes the sub-preforms to separate from one another along discrete fuse zones and form into individual conductive balls. Cooling the assembly to below the melting temperature of the conductive material fixes the configuration and positions of the array of conductive balls on the ball receiving areas of the substrate.

23 Claims, 3 Drawing Sheets

DEVICE AND METHOD FOR FORMING AND ATTACHING AN ARRAY OF CONDUCTIVE BALLS

BACKGROUND

1. Field of Invention

This invention relates to methods and devices for the formation and attachment of conductive balls to a substrate, and more specifically to methods and devices for forming and attaching conductive balls to substrates used in semiconductor devices.

2. Discussion of Prior Art

As semiconductor devices have become larger and more complex, the number of input and output ports on the devices has increased significantly. With that increase has come a need for more leads on the packages that house complex semiconductor devices. As lead count has grown, it has been necessary to reduce the spacing between adjacent leads to conserve space and to preserve the performance of the devices. The resultant packages with fine pitch leads present significant problems in handling and placement. To alleviate those problems, a new package type, known as the ball grid array (BGA) has been developed. On BGA packages, the fine, peripherally attached, flying leads of conventional surface mount packages are replaced with an array of conductive balls. Typically those conductive balls are composed of solder and attached to one surface of the BGA package substrate. The resultant packages are considerably more robust and significantly easier to mount properly than conventional surface mount packages.

All current methods of attaching solder balls to BGA packages start with discrete spheres of solder of precisely controlled volume. The most common diameter for these spheres is 0.75 mm and the number of balls on a given package can be from around one hundred to several thousand. Current BGA packages are most common with 169 to 540 balls.

The prior art offers several methods of positioning and attaching solder balls to a ball grid array substrate. All involve positioning discrete solder spheres on individual, solder ball receiving areas on the substrate. The solder ball receiving areas are typically conductive pads with a solder wettable surface. The solder balls are then melted and the molten solder forms a metallurgical joint between the pad and the solder. The first challenge to these procedures is to position one and only one solder ball on each pad, and to do so at minimum cost. While there are several methods for distributing the solder balls to their proper locations, all of these processes encounter a second challenge; that of keeping hundreds of very small spheres in their proper location until they can be heated to melt the solder. Accomplishing that is understandably difficult and the consequences of failure is a costly rework in the best case and loss of the entire device in the worst case. In most of these methods, a rosin type solder flux is used to temporarily tack the solder balls to the pads. Because of the relatively weak adhesive quality of the flux, it is still easy to dislodge a ball after it has once been properly positioned. Balls displaced after initial proper placement most commonly become conjoined with a neighboring ball. The result is one or more pads that have solder balls with two or more times as much solder as intended and one or more pads that have no solder ball at all. Because of the susceptibility of these methods to fail to supply a ball for every pad, and the vulnerability to subsequent displacement of the balls, a very reliable inspection system is essential for identifying packages with displaced balls for rework.

There are two common methods employed to position discrete balls on package substrates. One involves using a mask with a pattern of holes in the mask that corresponds to the pattern of solder ball receiving areas on the substrate. The combination of the mask thickness and the hole diameter is such that only one solder ball can occupy a hole at a time such that a resident ball in a given hole is securely captured as long as the bottom of the mask is closed by the package substrate. The process involves applying solder flux to the pads, positioning the mask over the pads on the package substrate, filling each of the holes with a solder ball and then lifting the mask straight up to leave a ball on each pad. While the mask method requires little capital equipment, it is slow and highly labor intensive. This method is also the most prone to missing balls due to the lack of a method of positively capturing the solder balls.

The other common method of positioning solder balls is taught in U.S. Pat. No. 4,871,110, issued to Fukasawa et al on Oct. 3, 1989. An improvement to that method is taught in U.S. Pat. No. 5,284,287 issued to Wilson et al on Feb. 8, 1994. Both patents teach the use of a vacuum tool to capture individual balls, one for each of the pads, and then transferring those balls to the pads on the BGA substrate. Wilson adds a method of adding sticky solder flux to the balls after they have been captured by the vacuum tool and before they are transferred to the pads on the substrate. Use of a vacuum to capture and hold the solder balls does reduce the probability of missing balls but does not completely eliminate the problem of missing balls. The need to apply solder flux that can temporarily maintain the position of the solder balls complicates the process of applying flux, and as practiced by Wilson, introduces the potential for displacing balls from the vacuum tool during the fluxing operation. The vacuum methods are faster and more automatable than the mask methods but also require significantly more capital equipment and tooling. While the vacuum methods are faster, the process steps must be carried out very deliberately and there are rate constraining steps during the solder ball capture and the flux application steps that limit the ultimate speed of the process.

A new product employs a third method that is similar to that taught by Reid in U.S. Pat. No. 4,2216,350, issued Aug. 6, 1980. Reid teaches the use of a non-fusible web to hold toroid shaped solder preforms to apply solder to the terminal pins of semiconductor packages which are designed to be mounted by soldering the terminal pins in the holes of printed circuit boards. The new product substitutes spherical shaped masses of solder captured in a non-fusible web. The product is designed to be positioned on the BGA substrate such that the solder spheres are directly above, or in contact with the pads on the substrate. The system is then heated to above the melting point of the solder to melt and release the solder masses, which then wet the pads and form the metallurgical bonds with the pads. While this method virtually eliminates the necessity for capital equipment for positioning the solder balls with a manual process and significantly reduces the cost of automating the process, it does not eliminate the problem of missing solder balls. The non-fusible web is relatively weak and the solder balls are held in place by friction. Any flexing of the carrier during handling is liable to displace one or more solder balls. While the non-fusible carrier does eliminate much of the capital cost of solder ball attachment, the cost of solder balls mounted in the carrier is much greater than if they were purchased in bulk as discreet balls.

Adding to the cost of all of these methods is the cost of the solder balls themselves. The value of the metal in 1,000, 0.75 mm diameter solder balls is on the order of $0.03 but the price of said balls is over 10 times that. The cost of the solder balls over the value of the metals is the result of the complexity of the manufacturing, grading and handling of such small and precise spheres.

Despite the sophistication of some of the current methods, all of the heretofore known methods for forming and attaching solder balls to ball grid array substrates suffer from a number of disadvantages:

(a) The processes most commonly used to attach solder balls to BGA packages is cumbersome and tedious and perceived to be so by most of those responsible for implementing such processes. There is the perception, held by many of those same people, that one of the keys to promoting the BGA style package to the level of a commercial success, is providing a method of ball attachment that can be more easily and more widely implemented.

(b) The processes used to position the hundreds of individual solder balls are susceptible to either omitting balls, misplacing balls or introducing extra balls. Misplaced or missing balls, if not corrected by a rework process, render the package useless. Since ball attachment is typically the last step in the packaging process, the loss of a package during the ball attachment operation also means the loss of the device in the package. Since BGA packages are used primarily for high lead count, high value devices, the failure to attach a few dimes worth of solder balls could result in the loss of a microprocessor worth hundreds of dollars.

(c) Prior art BGA substrates, which have hundreds of tiny, weakly adhering solder balls require extra care in handling as the individual balls are prone to displacement.

(d) The cost of positioning hundreds of discrete spheres is high.

(e) The cost of producing the small, precise balls of solder alloy is many times the value of the solder alloy.

(f) Inspection systems capable of identifying a small percentage of packages with missing and/or displaced solder balls virtually demands automated vision systems which are very expensive.

(g) Current solder ball attachment processes use rosin type, "sticky" solder flux to maintain the position the solder balls between the time they are initially positioned and the time they are melted and bonded to the receiving pads of the substrate. While the flux serves its purpose as a glue and is an effective flux, it is difficult to clean off after reflow and incompatible with soldering processes that use no-clean fluxes or no flux at all. Rosin type fluxes require cleaning solvents that are toxic and damaging to the ozone layer and as such are rapidly being replaced by materials and processes that do not require solvent cleaning.

OBJECTS AND ADVANTAGES

Accordingly, several objects and advantages of the present invention are:

(a) to provide a very simple method of positioning the solder required for all of the solder ball receiving areas on a BGA package in a single, quick operation that is adaptable to any level of automation, from strictly manual to completely automated with no loss of utility or accuracy;

(b) to provide a process that assures that there is one and only one solder mass for each solder ball receiving pads on a BGA substrate;

(c) to provide a process that eliminates the possibility of an individual solder ball being displaced after initially being properly positioned and generally provide a more robust system with respect to the processing that occurs after the balls are positioned on the substrate and before the solder is melted and the metallurgical joint is formed;

(d) to provide a process that significantly reduces the overall cost of positioning and attaching solder balls to BGA substrates;

(e) to provide a process wherein the starting material is produced by a much simpler process and is thereby significantly less expensive than producing individual, precision solder balls.

(f) to provide a process wherein the intrinsic process capability is great enough to allow for process control using statistical process control methodology and thus eliminate the need for elaborate and expensive inspection systems;

(g) to provide a process that is compatible with no-clean fluxes and fluxless soldering systems.

Further objectives and advantages of my invention will become apparent from consideration of the drawings and ensuing description.

Reference Numerals in drawings

| 10 conductive ball array preform | 12 sub-preform |
| 14 hole | 16 fuse zone |
| 18 ball receiving pad | 20 substrate |
| 22 solder ball | 24 protrusion |
| 26 ideal separation plane | 27 reduced fuse zone |
| 28 reduced fuse zone | 29 dielectric material |
| 30 conductive film | 32 overcoat |
| 34 well | |

DESCRIPTION - FIGS. 1 TO 7

Figure 1:
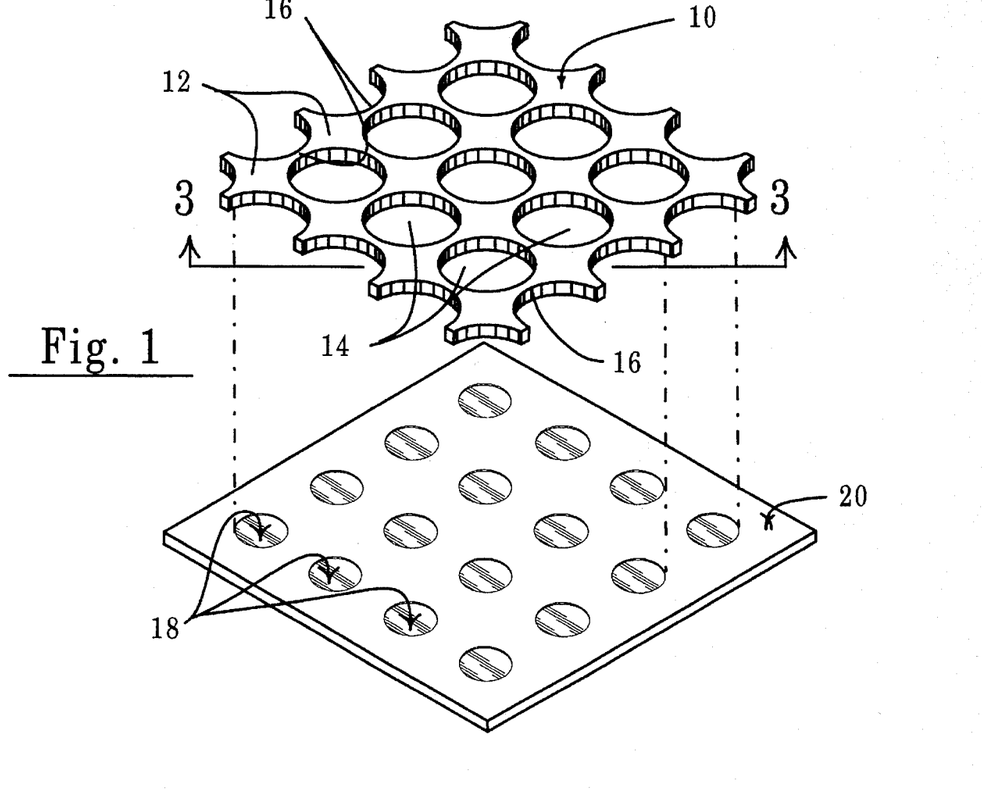
FIG. 1 shows a perspective view a of solder ball array preform and its basic components in relation to a substrate on which it will be positioned.

A typical embodiment of the conductive ball array preform of the present invention is illustrated in FIG. 1. In this embodiment, the preform 10 is used to form and attach conductive balls, preferably solder balls, to a ball grid array (BGA) substrate. The preform 10 is really a matrix of connected solder masses that are themselves preforms or sub-preforms 12 of the solder ball array preform. The physical limits of the sub-preforms 12 are defined by an array of holes 14 in an otherwise continuous sheet of solder. Each sub-preform 12 is connected to it nearest neighbors at fuse zones 16. Each fuse zone 16 is the narrowest section of solder between the edges of two adjacent holes 14. A substrate 20 having an array of areas for receiving solder balls or other conductive balls is also provided. The position of each of the sub-preforms 12 within the preform 10 corresponds with the position of one of the plurality of ball receiving areas or pads 18 arrayed on the surface of substrate 20. Substrate 20 may be comprised of any chosen material. The present invention is particularly applicable to the manufacture of semiconductor devices and as such, substrate 20 may be comprise any substrate material common to the semiconductor industry. Preferred substrate materials include, but are not limited to ceramics, printed circuit board materials, flexible circuit materials, semiconductor wafer materials, and the like. Pads 18 are provided with a surface that is capable of being wetted by, and forming a metallurgical bond with the solder in its molten state.

Preform 10 is positioned on substrate 20 such that each sub-preform 12 is directly above and substantially in contact with its corresponding pad 18.

Heating preform 10 and substrate 20 to above the melting temperature of the solder 10, causes the sub-preforms 12 to melt and wet pads 18 and sub-preforms 12 to separate from their nearest neighbors at fuse zones 16. The wetting of pads 18 by sub-preforms 12 causes the formation of a metallurgical bond between the solder material of the sub-preforms and pads 18. Surface tension of the molten solder then causes the molten solder to assume the desired, substantially spherical shape.

Figure 2:
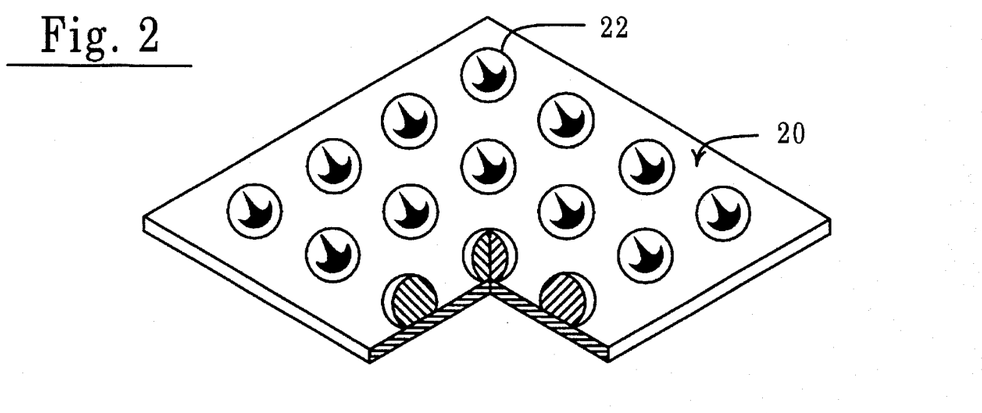
FIG. 2 shows a substrate with formed and attached solder balls.

FIG. 2 illustrates substrate 20 with an array of substantially spherical solder balls 22 which have been metallurgical attached to its surface. This arrangement is the result of the application of preform 10 to substrate 20 and subsequent melting and refreezing of the solder.

Figure 3:
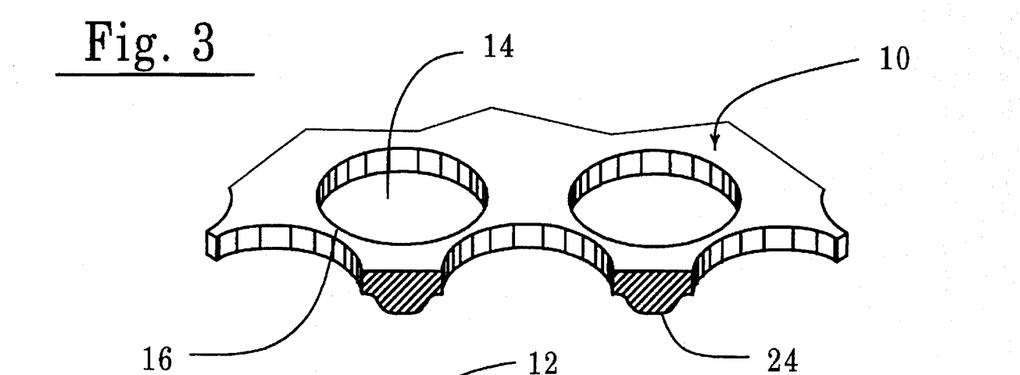
FIG. 3 shows details of a solder ball array preform and its components.

FIG. 3 illustrates the detail of sub-preforms 12 and their connection to preform 10. In the preferred embodiment, the minimum width of fuse zone 16, as measured from the nearest edges of adjacent holes 14, is made as small as is consistent with maintaining the basic relationship of the array of sub-preforms 12 through normal handling. The cross section of sub-preforms 12 in FIG. 3 reveals protrusions 24 provided on the surface of preform 10 that makes the initial contact with substrate 20. The design of protrusions 24 is such that when preform 10 is positioned on substrate 20, only the bottom portions of protrusions 24 makes contact with the substrate 20 are the bottoms of protrusions 24. Further, the protrusions 24 are designed such that their bottom surfaces have a predetermined diameter which is selected to be smaller than the diameter of ball receiving pads 18.

Figure 4:
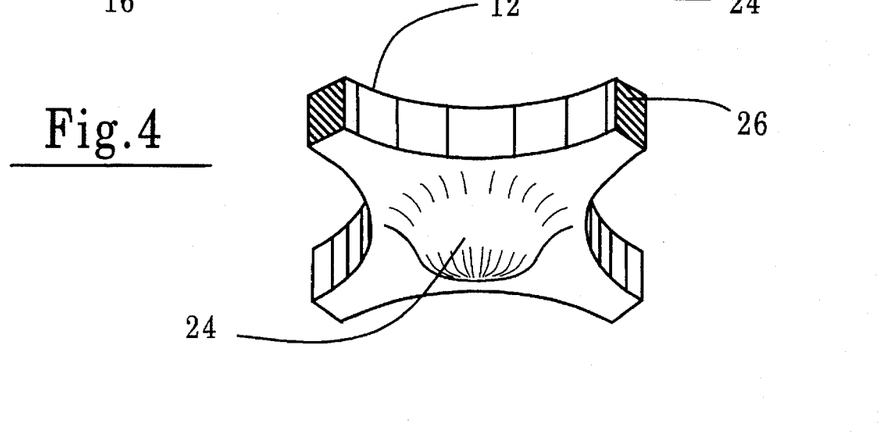
FIG. 4 shows details of a sub-preform, from a solder ball array preform, that will form one solder ball.

When preform 10 is properly positioned relative to substrate 20 and its array of pads 18, preform 10 makes contact with substrate 20 only on the bottoms of the array of protrusions 24. Additionally, the array of protrusions 24 contact only the array of pads 18. FIG. 4 illustrates the configuration of sub-preform 12, as it exists within preform 10. An ideal separation plane 26 is the optimal plane of separation between adjacent sub-preforms 12.

Preform 10 is designed to be manufactured by a stamping or forging operation to reduce manufacturing costs to a minimum and to provide the flexibility to tailor the contours of sub-preforms 12 to meet the demands of individual applications. While the configuration of preform 10 of FIG. 1 and sub-preform 12 as shown in FIG. 4 are simple and relatively inexpensive to tool for stamping or forging, many variations am possible. Those include variations in the shape of holes 14 and the details of protrusions 24 as well as changes in the cross sectional area and shape of fuse zones 16. Example alternative designs for reduced area fuse zones are indicated by numerals 27 & 28 of FIG. 5.

Figure 6:
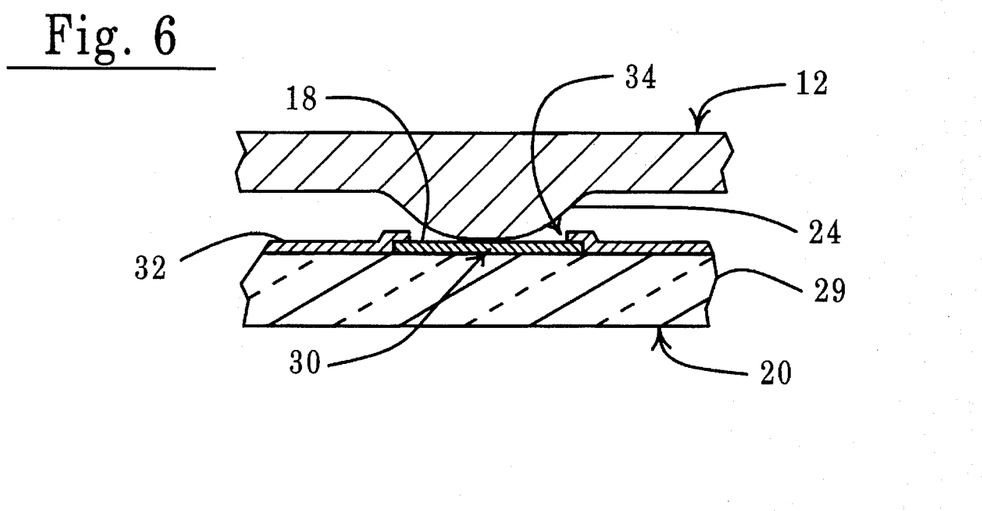
FIG. 6 shows a cross section of a sub-preform relative to a substrate and its components.

FIG. 6 illustrates the details of the relationship between sub-preforms 12 and substrate 20. It also illustrates the typical structure of substrate 20 in the preferred embodiment of the invention. Substrate 20 typically consists of one or more layers of dielectric material 29 to which a circuit pattern 30, comprised of electrically conductive film, for example copper, aluminum, or tungsten, is attached. In standard manufacturing practice, the circuit pattern or conductive film 30 is larger than pad 18 and extends from pad 18 to connect other portions of the circuit pattern. In order to produce pads 18 of a predetermined size and shape, regardless of the size and shape of circuit pattern 30, a thin overcoat 32 of material resistant to wetting by the molten solder is applied to the surface of substrate 20. Overcoat 32 is applied everywhere on the surface of substrate 20 except where the solder is intended to wet the pads 18. The result is an array of shallow wells 34 each having edges defined by the overcoat 32, a bottom defined by the pads 18. In use, preform 10 of the present invention, is positioned on substrate 20 in such a way that the array of protrusions 24 make contact with, and rest on the array of pads 18, within wells 34.

Figure 7:
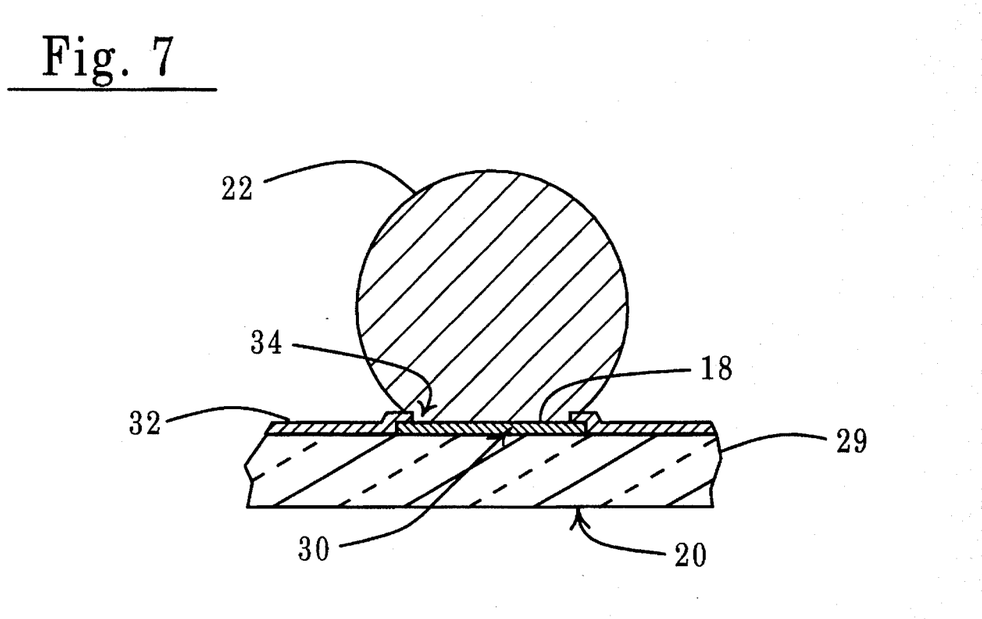
FIG. 7 shows a cross section of a solder ball attached to a substrate.

FIG. 7 illustrates the result of heating the combination of substrate 20 and preform 10 to above the melting point of the solder. When sub-preforms 12, of FIG. 6, reach the melting point of the solder, they melt, wet and wick to pads 18 thereby forming metallurgical bonds between the solder and pads 18. The surface tension present in the molten solder causes the individual sub-preforms 12 to separate at their respective fuse zones 16 (see FIG. 3) and pull together to form the desired substantially spherical shape of solder balls 22. Cooling the structure to below the melting point of the solder causes the solder to refreeze and set the final structure of the solder ball array attached to substrate the 20 as illustrated in FIG. 2.

OPERATION - FIGS. 1–7

The present invention reduces the cost of labor, the capital equipment and the materials required for attaching solder balls to ball grid array substrates. At the same time it eliminates the previously described problems of missing balls during the initial placement, and displacing balls during handling. While existing solutions to the problem of positioning a plurality of solder balls in an array emphasize methods for positioning an array of discreet solder balls, the present invention emphasizes the use of a sheet type preform that contains the solder for all of the solder balls in the array. The preform is really a plurality of individual sub-preforms connected in an array. It is a continuous sheet of solder material except for an array of holes through the sheet. A small portion of a solder ball array preform, containing 16 individual sub-preforms 12 is illustrated in FIG. 1.

The manner of using the solder ball array preform is quite different from previous processes. The most obvious difference is that all of the solder required for a large array of solder balls is supplied by a single preform 10. Additionally the preform 10 supplies solder in a shape that is not remotely similar to the desired final shape of solder balls 22. Placing preform 10 on substrate 20 is a significantly less tedious operation and can in fact be accomplished by hand. The required precision in placement is that protrusions 24 of FIG. 3, make contact with the array of pads 18 of FIG. 1. In accordance with the current standard BGA packages, the preform 10 should be positioned and aligned within about 0.4 mm of the ideal position. This is a practical task for a person with good hand to eye coordination and good vision, without the aid of tools or vision enhancing equipment. In the most common embodiment of substrate 20, as illustrated in FIG. 6, the presence of overcoat 32 and the resulting well 34 provide a tactile aid in positioning preform 10. Protrusion 24 also acts as a detent in well 34. This provides a means of retaining preform 10 in its proper position in the face of small forces parallel to the plane of preform 10.

While strictly manual application of preform 10 to substrate 20 is not expected to be a preferred production means, the ability to thus implement the invention is very significant for several reasons. First it allows perspective manufactures of BGA packages to experiment with the processes and implement limited production without a large capital investment. Secondly, it changes the perception of solder ball attachment from that of a process that is beyond the ability of most and difficult for all, to one that can be accomplished by relatively unskilled or semi-skilled labor, on a small or large scale with good results.

Automated means of positioning the preform 10 on a substrate 20 range from simple jigs that align the two components to fully automated, robotic pick and place systems. While the automated systems will be the most cost effective in the long term and most appropriate for high volume production, a primarily manual system with simple alignment jigs can position the material necessary for an array of solder balls more quickly, and thus less expensively, than the much more capital intensive methods that position an array of loose solder balls.

FIG. 1 illustrates the application of a solder ball array preform to a substrate. Preform 10 is positioned such that the array of sub-preforms 12 make contact with the array of pads 18 through protrusions 24 of FIG. 3 and FIG. 4. That relationship is shown in detail in FIG. 6. The protrusions 24 of FIG. 3 and FIG. 4 serves several purposes. Among the most important of those is to assure contact of sub-preforms 12 with pads 18 and initiate wetting of pads 18 by the molten solder. By providing suitable protrusions 24 on each sub-preform 12, this will happen even if there is a pool of solder flux in well 34, illustrated in FIG. 5. As such, the design of protrusions 24 must be such that the individual protrusions easily fit inside there respective well 34, and concentrate the mass of the respective sub-preforms 12 in a small enough area in order to insure that they will penetrate and displace liquid flux if present. Protrusions 24 also provide a sound thermal contact between pads 18 and sub-preforms 12, thereby assuring that they remain at, or very near an even desired temperature as the temperature of the system is cycled from room temperature to the melting point of the solder, thus further facilitating the rapid wetting of pads 18 by the solder when it melts.

In addition, the protrusions 24 facilitate the concentration of the mass of each respective sub-preform 12 as far away from the center of mass of an adjacent sub-preform 12 in order to reduce the risk of the adjacent sub-preforms 12 from being pulled together by surface tension. Finally, the protrusions 24 act as a detents when positioned in well 34. This feature provides a tactical indicator of the proper positioning of the preform 10 relative to a substrate and its array of solder ball receiving pads. The detent feature also provides a means for maintaining the proper positioning of the preform in the face of moderate forces parallel to the plane of the preform.

Prior are methods for positioning solder balls on a substrate that utilize discrete solder balls on each pad 18 most commonly use rosin type "sticky" or "tack" solder flux to temporarily stick the balls to the pads. While such methods which use rosin type solder fluxes do provide necessary adhesive quality and adequately fluxes the pads in order to facilitate good solder joints, these methods are expensive in several ways. The application of sticky flux is slow relative to other fluxing and surface preparation methods. Additionally, rosin fluxes require a difficult cleaning step after reflow that typically utilizes fluorinated and chlorinated solvents that are hazardous to humans and to the environment. The trend in soldering processes for electronic assemblies is toward fluxes that do not need to be removed after reflow and to processes that require no flux at all. Discrete solder ball placement methodologies are not compatible with these modern soldering processes.

The high surface tension of molten solder alloys and the tendency of natural systems to minimize surface tension are the phenomena that allow the use of connected sub-preforms and sub-preforms that do not resemble the final shape of the solder balls. First of all, the high surface tension of the melt drives the wetting of pads 18 to reduce surface tension at that interface. The wetting of pads 18 by the molten solder and the subsequent formation of metallurgical bonds at each pad/solder interface effectively pins the bulk of the solder in place around pads 18. The generally high surface tension of the system and the very high surface tension to volume ratio at fuse zone 16 drives the separation of adjacent sub-preforms along ideal separation planes 26. After the sub-preforms have separated, the surface tension of the molten solder drives the mass of the molten solder to assume the shape with minimum surface area. That force as balanced against gravity which tends to maximize surface area and reduce potential energy. With the small volume of solder in each solder ball for BGA applications, that shape is the desired, substantially spherical shape of solder balls 22 in FIG. 2.

Referring to FIG. 3 and FIG. 4, fuse zones 16 are important to the structural integrity of preform 10. They must be made large enough to insure that all of sub-preforms 12 maintain their proper relationship through the handling necessary to implement the invention. In opposition to that requirement is the need to reduce the cross section of fuse zones 16 to insure quick and clean separation of sub-preforms 12. Fuse zones 16 are the means that provide for the division of preform 10 into individual solder masses that will each produce one solder ball. In practice there is considerable overlap between minimum cross section required for strength and the maximum cross section consistent with clean separation. For a preform 10 with center to center spacing of 1.5 mm. I have found that a cross sectional area of $6 \times 10^{-4}$ sq. mm does meet both criteria.

Figure 5:
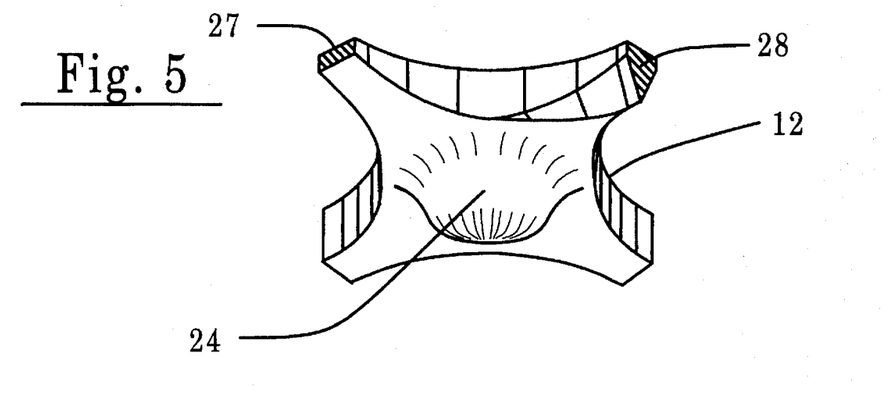
FIG. 5 shows details of modification of the fuse area of a solder ball array preform.

The cross sectional area of fuse zone 16 should also be reduced to as small a value as is consistent with the strength requirements to assure the best uniformity of solder ball sizes. It is impossible to assure that every fuse zone 16 will separate exactly along ideal separation plane 26. Therefore the design of fuse zone 16 must accommodate separation somewhere other than on plane 26 without producing solder balls that are larger or smaller than required. The current specification for the diameter tolerance of solder balls used in solder ball attachment methods that utilize discreet solder balls is plus or minus 0.00254 mm. For an nominal 0.75 mm solder ball, that equals a volume tolerance of plus 21% to minus 19%. In the worst case, where the preform is of constant thickness, actual separation of adjacent sub-preforms 12 to produce such a great volume deviation from nominal would require that the actual separation occur on one plane that is displaced more than 0.35 mm from plane 26. If the deviation occurred in all four fuse zones 16 of a given sub-preform 12, the planes must all be displaced by more than 0.25 mm in the same direction relative to the center of sub-preform 12. Due to the dynamics of flow of molten solder and the distribution of forces associated with surface tension, the probability of that occurring is remote. In the preferred embodiment, where cross sectional area of fuse zones 16 is reduced and the mass of the solder in each sub-preform 12 is moved toward the center of the sub-preform, the probability of the process producing over-sized or under-sized balls is extremely remote. Examples of designs that reduce the cross sectional area of fuse zones 16 are illustrated in FIG. 5 and are indicated by numerals 27 and 28.

Planar solder preforms for related, but simpler applications have been manufactured by etching. Etching is not, however, a practical manufacturing approach for the preform of the present invention. For volume applications, etching is far too expensive and it does not allow for the creation of the complex shapes that give the present invention the functionality and reliability necessary for commercial success. Only stamping or forging meet the cost and design objectives of the present invention. Further, forging allows for the incorporation of the those shape and design features into a preform that are difficult and expensive to incorporate using any other forming method. Common solder alloys are particularly well suited to the type of forging required for the present invention. Even at room temperature, those metals exhibit adequate ductile flow properties to produce the preform of the current invention with low working pressures. Further, the sheet like aspect ratios of preform 10 of FIG. 1, and the ease with which solder alloys are formed into sheets, makes sheet stock the ideal feed material for the forging process. The combination of these factors mean that solder ball array preforms as described herein can be forged at a high rate with relatively lower pressures, on low cost presses, and from tools that are either inexpensive or extremely long lived.

In the preferred embodiment, the forging process is multi-staged within a single die, starting with sheet stock of predetermined thickness. The top of the die is contoured to produce the contours of the top of preform 10 of FIG. 1, and has a plurality of punch pins that correspond with the position and shape of holes 14 in preform 10. The bottom of the die is contoured to produce the shapes of the bottom of preform 10, and has a plurality of holes to receive the punch pins of the top half of the die. Forging progresses, with sheet stock of solder material in the die area, as the punch pins pierce the sheet of solder and remove material to produce holes 14. After the punch pins have traversed the full thickness of the sheet stock, the shallow contoured portions of the top and bottom die engage the sheet stock and begin displacing metal to the deep contours of the die. The flow of metal is limited to moving metal from fuse zones 16 to protrusions 24. The limited displacement and low viscosity metal allow for the use of low pressures and for the practical use of the punch pins as anvils against which the metal is formed.

SUMMARY, RAMIFICATIONS AND SCOPE

Accordingly, the reader will see that the solder ball array preform of this invention can be used to position and form solder balls on a ball grid array substrate or on a semiconductor device, for example, and that it is economical, simple and highly reliable. Further that the solder ball array preform has additional advantages in that:

the solder required for all of the solder balls in an array is transferred to a substrate in a single step as one connected array of solder;

the fixed relationship of each individual sub-preform within the main of principle preform assures that there is one and only one solder ball on each pad and that individual solder balls cannot be displaced before reflow;

the cost of equipment to place solder ball array preforms, even for automated processes is significantly less than for previous methods;

the steps involved in positioning an array of solder balls are fewer and simpler resulting in significantly higher production rates at all levels of automation; and the present invention provides a solder ball attachment process that does not require hazardous cleaning solvents to remove flux residues after melting the solder to form conductive balls.

It should be noted that the preceding descriptions are directed at a particular embodiment of the present invention and that they should not be construed as limiting the invention. Also, that various modifications and other embodiments of the present invention will be apparent to one of ordinary skill in the art to which the present invention pertains. For example, the shape of the holes separating individual sub-preforms may be of any shape consistent with the desired volume of the individual sub-preforms and the average thickness of the preform. In addition the shape of the protrusion may be any desired that will make contact with the solder ball receiving areas. It is also important to note that the present invention is not limited to forming and attaching solder balls but may be used with any material that has sufficient surface tension to form a ball of the desired size when molten, is capable of wetting and forming a bond with a provided receiving area, and melts at a temperature below the melting, charring or flash point of the substrate. Furthermore, it is recognized that conductive balls attached in accordance with the present invention need not be in a regular array configuration.

Therefore, while the present invention has been described in conjunction with particular embodiments it is to be understood that these various modifications and other embodiments of the present invention may be made without departing from the scope of the present invention as described herein and as claimed in the appended claims.

I claim:

1. A preform of conductive material capable of being formed into a plurality of conductive balls for accurate and secure attachment to respective conductive ball receiving areas of a substrate, comprising in combination:

(a) a substantially planar structure having an upper plane and a lower plane, said upper and lower planes being separated by a maximum thickness;

said preform also incorporating upper intermediate and lower intermediate planes, said intermediate planes being separated by a minimum thickness;

(b) said preform being perforated with a plurality of through-holes to define a matrix of sub-preforms, each said sub-preform comprising a substantially non planar structure, having a thickness that varies from said minimum thickness to said maximum thickness, wherein:

(i) said sub-preforms are connected to one another by thinned regions of conductive material;

(ii) said sub-preforms being spaced form one another so as to be coordinated with respective individual conductive ball receiving areas of a substrate;

(iii) said preforms incorporate contacting means, said contacting means being solid protrusions of said conductive material, extending to said upper plane from said upper intermediate plane and to said lower planes from said lower intermediate plane, for the purpose of making positive contact between said preform and said substrate when the preform is superposed above and, substantially parallel to said substrate; said contacting means further comprising in combination:

a) protrusions on each of said sub-preforms of said preform;

b) said protrusions being substantially centrally located relative to the through holes defining each sub-preform;

c) said protrusions configured in a shape selected from the group consisting of column, cone, truncated cone, spherical section and hyperboloid;

(iv) each of said sub-preforms contains a volume of conductive material sufficient to form a conductive ball of a desired diameter as said preform is heated for a length of time above a melting point of said conductive material such that said preforms separate from each other along said thinned regions, each conductive ball for attachment to a respective conductive ball receiving area of said substrate, thereby providing a means for attaching an array of accurately sized spheroids of conductive material to a substrate with greater accuracy and reliability, and at lower cost that with current methods.

2. The preform of claim 1 wherein said projections are configured in a combination of shapes selected from the group consisting of column, cone, truncated cone, spherical section and hyperboloid.

3. The preform of claim 1 wherein said conductive material is solder.

4. The preform of claim 3 wherein said solder is an alloy of metals selected from the group consisting of lead, tin, indium, silver, zinc, bismuth, antimony, gallium, germanium, silicon and gold.

5. The preform of claim 3 wherein said solder has a melting temperature between 100° C. and 365° C.

6. The preform of claim 1 wherein said preform is created by a forging operation.

7. The preform of claim 6 wherein the forging operation is a cold forging operation.

8. A preform of conductive material capable of being formed into a plurality of conductive balls for accurate and secure attachment to respective conductive ball receiving areas of a substrate, comprising in combination:

(a) a substantially planar structure having an upper plane and a lower plane, said upper and lower planes being separated by a maximum thickness;

said preform also incorporating an intermediate plane, said intermediate plane being separated from said upper plane by a minimum thickness;

(b) said preform being perforated with a plurality of through-holes to define a matrix of sub-preforms, each said sub-preform having a thickness that varies from said minimum thickness to said maximum thickness, wherein:

(i) said sub-preforms are connected to one another by thinned regions of conductive material;

(ii) said sub-preforms being spaced form one another so as to be coordinated with respective individual conductive ball receiving areas of a substrate;

(iii) said preforms incorporate contacting means, said contacting means being solid protrusions of said conductive material, extending from said intermediate plane to said lower plane, for the purpose of making positive contact between said preform and said substrate when the preform is superposed above and substantially parallel to said substrate, said contacting means further comprising in combination:

a) a protrusion on each of said sub-preforms of said preform;

b) said protrusions being substantially centrally located relative to the through holes defining each sub-preform;

c) said protrusions configured in a shape selected from the group consisting of column, cone, truncated cone, spherical section and hyperboloid;

(i) each of said sub-preforms contains a volume of conductive material sufficient to form a conductive ball of a desired diameter as said preform is heated for a length of time above a melting point of said conductive material such that said preforms separate from each other along said thinned regions, each conductive bah for attachment to a respective conductive ball receiving area of said substrate, thereby providing a means for attaching an array of accurately sized spheroids of conductive material to a substrate with greater accuracy and reliability, and at lower cost that with current methods.

9. The preform of claim 8 wherein said projections are configured in a combination of shapes selected from the group consisting of column, cone, truncated cone, spherical section and hyperboloid.

10. The preform of claim 8 wherein said conductive material is solder.

11. The preform of claim 10 wherein said solder is an alloy of metals selected from the group consisting of lead, tin, indium, silver, zinc, bismuth, antimony, gallium, germanium, silicon and gold.

12. The preform of claim 10 wherein said solder has a melting temperature between 100° C. and 365° C.

13. The preform of claim 8 wherein said preform is created by a forging operation.

14. The preform of claim 13 wherein the forging operation is a cold forging operation.

15. A means of positioning a plurality of masses of fusible conductive material on a substrate having a plurality of receiving areas for said masses, comprising a preform of said conductive material, a superposing of said preform to said substrate, heating said preform to above the melting point of said conductive material to melt said conductive material and forming a bond between said conductive material and said receiving areas, and cooling to below the melting temperature of said conductive material to fix said plurality of masses to said receiving areas; said perform comprising in combination:

(a) a substantially planar structure having a maximum thickness, an upper plane and a lower plane, said planes separated by said maximum thickness;

a minimum thickness and an intermediate plane, said intermediate plane and said upper plane separated by said minimum thickness;

(b) a matrix of connected sub-preforms comprised of said conductive material and each said sub-preform including sufficient said conductive material to form one of said conductive balls of predetermined size;

(c) means of dividing said preform into individual masses, each containing substantially the material from one of said sub-preforms;

(d) a plurality of solid protrusions, one on each of said sub-preforms, located substantially centrally on said sub-preform, extending from said intermediate plane to said lower plane for making positive contact between each sub-preform and its respective mass receiving area.

16. The preform of claim 15 wherein said projections are configured in a shape selected from the group consisting of column, cone, truncated cone, spherical section and hyperboloid.

17. The preform of claim 15 wherein said projections are configured in a combination of shapes selected from the group consisting of column, cone, truncated cone, spherical section and hyperboloid.

18. The means of claim 15 wherein said dividing means comprises fuse zones of reduced cross sectional area connecting adjacent said sub-preforms.

19. The means of claim 15 wherein said conductive material is solder.

20. The means of claim 19 wherein said solder is an alloy of metals selected from the group consisting of lead, tin, indium, silver, zinc, bismuth, antimony, gallium, germanium, silicon and gold.

21. The means of claim 19 wherein said conductive material is a solder with a melting temperature between 100° C. and 365° C.

22. The means of claim 15 wherein said preform is created by a forging operation.

23. The means of claim 22 wherein said forging operation is a cold forging operation.

* * * * *